United States Patent [19]

Shinji

[11] Patent Number: 5,453,385
[45] Date of Patent: Sep. 26, 1995

[54] METHOD FOR MANUFACTURING SILICON SEMICONDUCTOR DEVICE WITH A GETTERING SITE

[75] Inventor: Uya Shinji, Kyungki-do, Rep. of Korea

[73] Assignee: Goldstar Electron Co., Ltd., Seoul, Rep. of Korea

[21] Appl. No.: 113,606

[22] Filed: Aug. 27, 1993

[51] Int. Cl.⁶ .................................................. H01L 21/308
[52] U.S. Cl. .................................. 437/11; 437/24; 437/53
[58] Field of Search .................................. 437/11, 24, 25, 437/27, 28, 29, 53, 70, 149, 150, 941, 959; 148/DIG. 40, DIG. 60

[56] References Cited

U.S. PATENT DOCUMENTS

| 4,371,403 | 2/1983 | Ikubo et al. | 437/11 |
| 5,098,852 | 3/1992 | Niki et al. | 437/11 |

FOREIGN PATENT DOCUMENTS

0105652  8/1981  Japan .................................. 437/24

*Primary Examiner*—Chandra Chaudhari
*Attorney, Agent, or Firm*—Poms, Smith, Lande & Rose

[57] ABSTRACT

A method for manufacturing a silicon semiconductor device with a high contamination sensitivity to heavy metals, such as Si-CCD solid state image sensors, wherein a gettering site is formed in an element isolation region present near an element region or the like, a non-depleted $n^+$ or $p^+$ region, a region to be removed or isolated from the surface of a semiconductor substrate in a subsequent process. This method makes it possible to form semiconductor devices while reducing the contamination of silicon substrate surfaces by heavy metals. The method also realizes the manufacture of silicon semiconductor devices exhibiting a stable device characteristic and having reduced defects.

8 Claims, 8 Drawing Sheets

METHOD FOR MANUFACTURING SILICON SEMICONDUCTOR DEVICE WITH A GETTERING SITE

BACKGROUND OF THE INVENTION

1. Field of the Invention

The present invention relates to a method for manufacturing a silicon semiconductor device, and more particularly to a method for manufacturing devices with a high contamination sensitivity to heavy metals, such as Si-CCD solid state image sensors.

2. Description of the Prior Art

In the manufacture of Si semiconductor devices, impurity contamination of Si wafers by heavy metals and the like is an important factor to degrade the characteristics and the reliability of devices produced.

In particular, solid state image sensors of charge coupled devices (CCDs) handling micro-signal charges are devices easily contaminated by heavy metals.

Such a contamination by heavy metals is also handled as an important problem in memory devices with a highly dense integration degree.

For improving the cleanliness in installations for manufacturing Si semiconductor devices and chemical materials, various ultra clean techniques have been proposed. One is disclosed in Ultra LSI Ultra Clean Technology Workshop No. 7 Announcement, Japanese Semiconductor Basic Technology Research Committee: May, 1990.

However, a more economical countermeasure is required, because an introduction of the above new techniques results in a great increase in installation cost.

On the premise that some degree of the contamination by heavy metal is inevitable, a method for gettering the contamination in a subsequent process has played an important part in solving the contamination problem.

Conventionally, various gettering methods have been used in the measurement of semiconductor devices with a high contamination sensitivity to heavy metals, such as Si-CCD solid state image sensors. The known gettering methods will now be exemplified.

Figure 3:
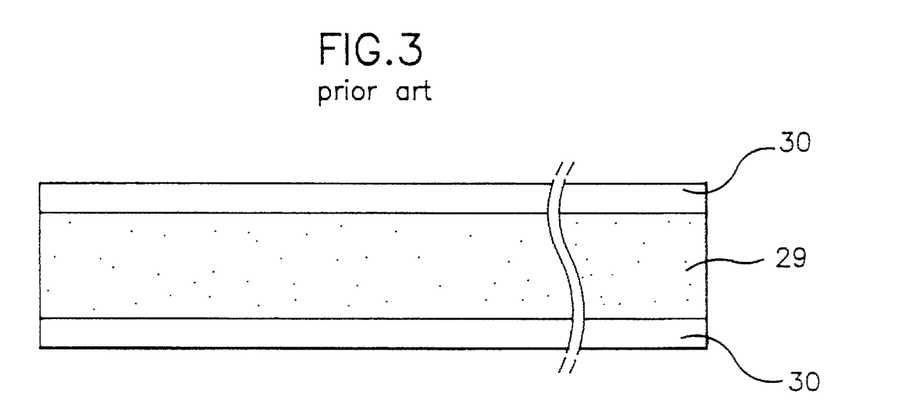

The first conventional method is illustrated in FIG. 3, wherein a layer 29 of bulk-micro-defects is formed in a silicon substrate 30, to be used as a gettering sink.

Figure 4A:
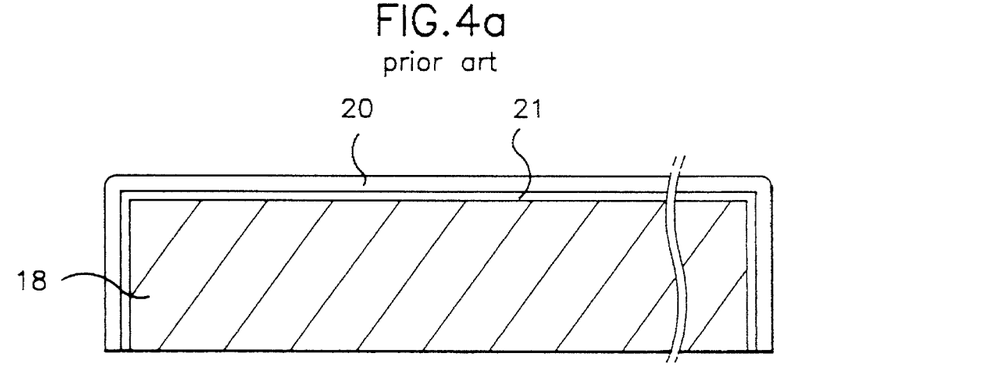
Figure 4B:
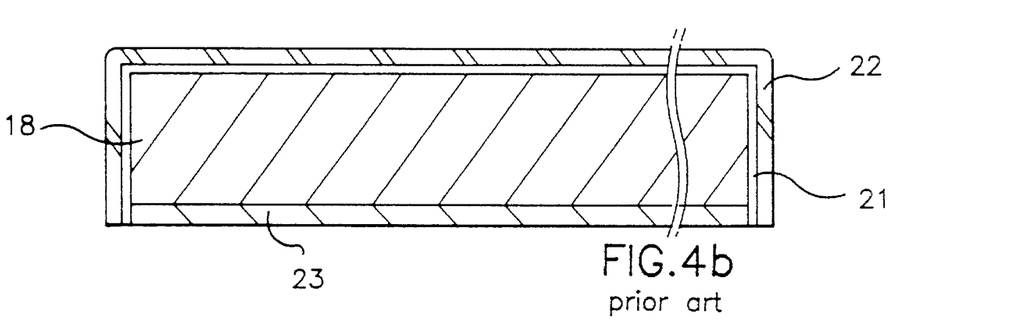

The second method is illustrated in FIGS. 4a and 4b. In accordance with this method, a silicon substrate 18 is subjected at its back surface to an exposure process, prior to a process for diffusing phosphorous ions in a polysilicon layer 20 covering the silicon substrate 18, as shown in FIG. 4a. Then, a high concentration phosphorous-diffused layer 23 is formed on the back surface of substrate 18, as shown in FIG. 4b.

Figure 5:
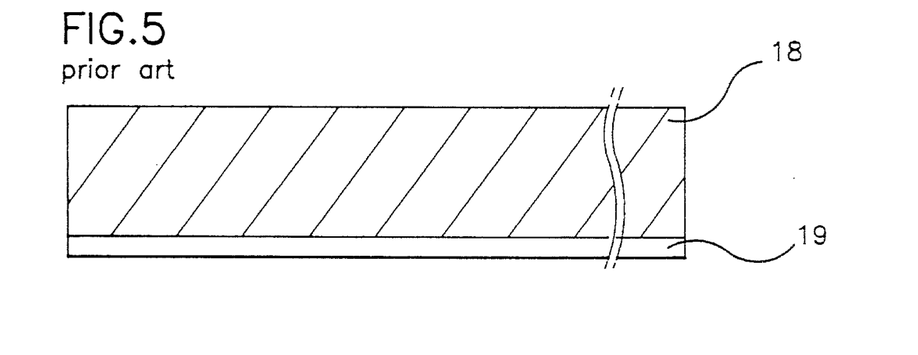

FIG. 5 illustrates the third method wherein a polysilicon layer 19 is formed on a back surface of a silicon substrate 18.

Figure 6:
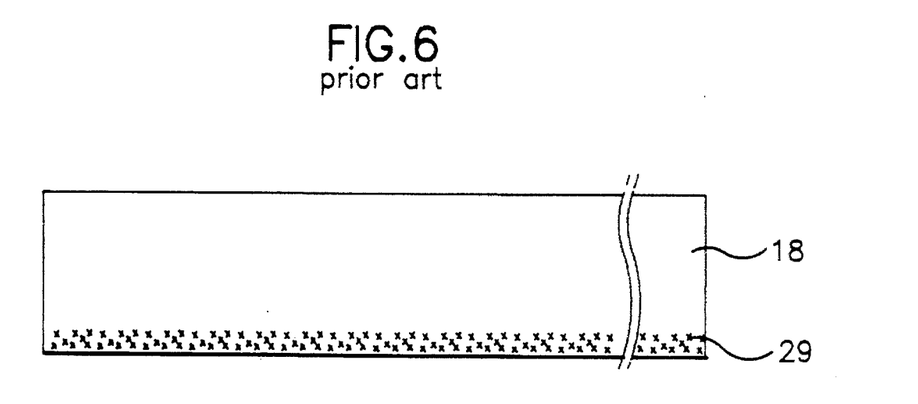

The fourth method is illustrated in FIG. 6, wherein a silicon substrate 18 is subjected at its back surface to an ion implantation or a sand blast treatment, to form a damage layer 29.

These methods provide an effect of improving a gettering capability of silicon substrates. However, it has been known that heavy metals once gettered become discharged in a heating process carried out at a relatively low temperature. It is also difficult to obtain a sufficient gettering effect by use of the process for diffusing phosphorous ions in the back surface of substrate, because the diffusion process is carried out at a low temperature and for a reduced time.

Furthermore, heavy metals may be liable to concentrate at a Si—$SiO_2$ boundary region or stress generating portions formed due to the structure of a device produced. It is also difficult to reduce the surface contamination by heavy metals in the substrate or the gettering site of the back surface of substrate.

Presently, a front-side gettering is under investigation, wherein a defect layer is formed as a gettering site is formed in a region disposed beneath an element region, by implanting ions of high energy, so that a sufficient gettering effect is obtained at a lower temperature and in a reduced treatment time (Japanese Applied Physics Institute, Spring Conference in 1991, 31a-X-8 to 11).

In particular, it has been discovered that in a case of an ion implantation with boron or carbon, a heavy metal gettering causing no re-discharge of heavy metal could be achieved.

However, this method requires a new installation for performing an ion implantation with high energy of above 1 MeV.

Figure 7A:
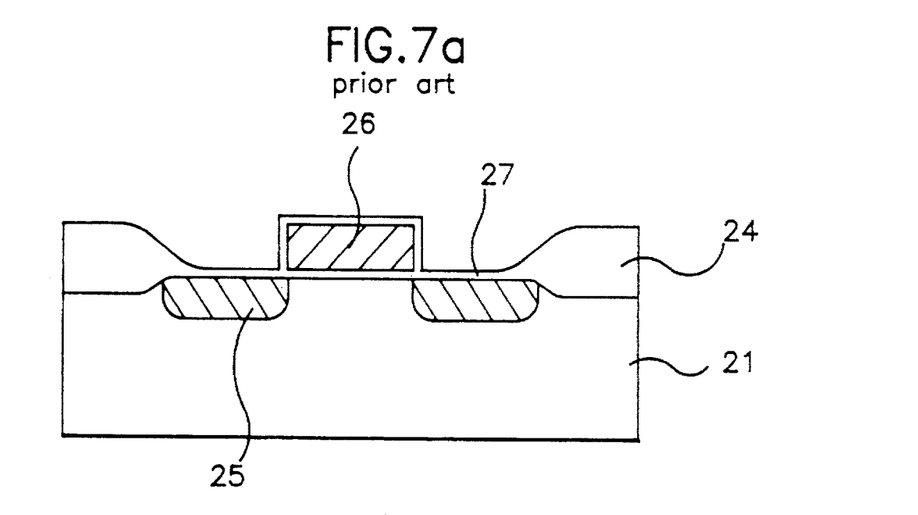
Figure 7B:
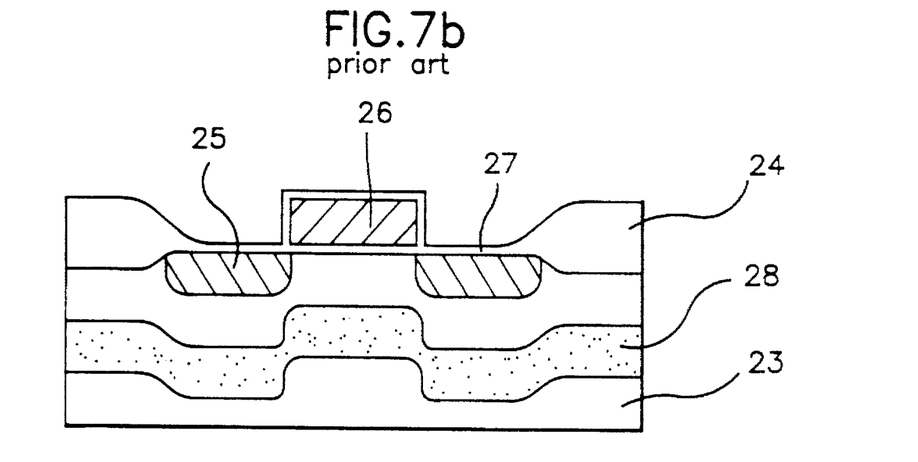

As ions of high energy are implanted in a substrate 18 formed with a MOS transistor, as shown in FIG. 7a, they pass through an element region, thereby causing a gettering site region 28 to be formed beneath the element region, as shown in FIG. 7b. As a result, measuring of damage caused by the high energy ions and curing of the damage are required to be evaluated for every device structure. Accordingly, the method can be hardly regraded as an economical method.

The present invention intends to solve the abovementioned problems. To this end, the present invention intends to provide a gettering method capable of efficiently reducing heavy metals accumulated in an element region on the surface of a silicon substrate, in particular, a Si—$SiO_2$ boundary region on the silicon substrate surface, without using any specific installation and with low cost.

Now, a gettering phenomenon importantly related with the present invention will be described.

Although various silicon crystal defects serve to getter heavy metal, they are re-discharged even at a relatively low temperature of 700° to 800° C. (Japanese Applied Physics Institute, Autumn Conference in 1992, 18p-ZH-5 Announcement No. 1, pp314).

It has been known that the gettering method utilizing an ion implantation was effective as a gettering method capable of preventing the re-discharge of heavy metals.

For instance, a very strong gettering capability was exhibited just after the implantation of boron ions. By an annealing treatment carried out after the ion implantation, Fe became gettered as if it overlaps with a boron profile exhibited just after the ion implantation (Y. Niki, S. Nadahara and M. Watabave: Proc. Int. Conf. Science and Tech. of Defect Control in Semicond., Yokohama, 1989, vol. 1, pp329).

There have been also reported gettering phenomenons of various elements. However, the gettering capability disappeared after a treatment was carried out at a high temperature of about 900° C.

This may be because atoms implanted are directly substituted for Si by the high temperature treatment, so that they intrude into crystal lattices.

It has been also known that in a case of implanting carbon ions, the gettering capability was kept in that carbon atoms could intrude hardly into crystal lattices, even after the high temperature treatment (Japanese Applied Physics Institute, Autumn Conference in 1992, 18p-ZH-11 Announcement No. 1, pp313).

In this case, the gettering site is a structure associated with a primary fault caused by an implantation of carbon ions or carbon atoms present between lattices. The gettering capacity is approximately proportional to the dose amount of carbon.

The primary fault which is a point fault serves to fix heavy metal. After the connection with the heavy metal, the primary fault is not grown as a larger fault structure. As a result, the primary fault is difficult to be grown as a dislocation or an oxidation induced stacking fault.

There has been also disclosed utilization of an element isolation region or the like, non-depleted $n^+$ and $p^+$ regions, or a region to be removed in a subsequent process, as a gettering site region formed by the carbon ion implantation.

This is based on the fact that the gettering site formed by the carbon ion implantation is the point fault which is not grown as a large fault causing a degradation in device characteristics, even when heavy metals are gettered without using a thermal diffusion.

It has been also confirmed that the gettering by the ion implantation occurs, irrespective of an accelerated voltage of ions.

Consequently, the ion implantation can be achieved only at a region near the substrate surface by use of conventional ion implanting devices. However, the undepleted region can be used as the gettering site.

When the region in which a gettering of heavy metals occurs is oxidized, the heavy metals are drawn into the oxide film produced, because the fixing of heavy metals is stably obtained.

Accordingly, it is possible to use the Si surface region drawn into the oxide film as the gettering site, in a subsequent process.

Of course, in this method, it is required to prevent the region predetermined as the gettering site from reaching a region adversely affecting the device characteristics.

Since semiconductor devices have various sensitivity to the fault, a proper margin of up to $3\sigma$ or $4\sigma$ for a projected range upon implanting ions should be selected for every device or depending the design thereof.

Of course, the dose amount of ions implanted should be considered. At a large dose amount of ions, the damage density at the ion-implanted region becomes higher correspondingly. The amount of fixed heavy metals becomes increased, thereby resulting in an increase in the possibility that the secondary fault is grown.

Accordingly, the dose amount of ions implanted has an upper limit.

Actually, it has been reported that a secondary fault occurred at the ion dose amount of about $10^{16}/cm^2$, thereby resulting in a degradation in gettering capability (Japanese Applied Physics Institute, Autumn Conference in 1992, 18p-ZH-10 Announcement No. 1, pp312).

It seems that the upper limit of the ion dose amount is considerably low when ions are implanted in a region near the element region. However, where ion implantations are carried out several times under a condition that the dose amount of ions is divided into sub-dose amounts and an annealing is carried out at every ion implantation, it is possible to use the total ion dose amount of $10^{14}/cm^2$.

SUMMARY OF THE INVENTION

Therefore, an object of the present invention is to provide a method for manufacturing a silicon semiconductor device, wherein a gettering site is formed in an element isolation region present near an element region or the like, a non-depleted $n^+$ or $p^+$ region, a region to be removed or isolated from the surface of a semiconductor substrate in a subsequent process.

In accordance with the present invention, an implantation of carbon ions is used as a method for forming the gettering site.

The method of the present invention is characterized by employing one of the following methods in manufacture of silicon semiconductor devices:

1. implanting carbon ions in an element isolation region of a Si semiconductor device;
2. implanting carbon ions in a region disposed beneath a Si—SiO$_2$ boundary, carrying out an annealing, oxidizing the Si surface to draw a region damaged due to the carbon ion implantation into the oxide film formed on the Si surface, removing the oxide film, and then carrying out the oxidization again;
3. implanting carbon ions in a $n^+$ or $p^+$ region of the Si semiconductor device; and
4. carrying the carbon ion implantations of the above-mentioned three methods at an accelerated voltage causing the projected range of ion implantation to be within 1,000 Å from the Si—SiO$_2$ boundary.

In accordance with the first method, the element isolation region which is implanted with carbon ions becomes the gettering site. Accordingly, the impurity of heavy metals present in the element region becomes gettered in the element isolation region.

Generally, the element isolation region is formed by use of a local oxidation of silicon (LOCOS) process. In accordance with this process, where the implantation of carbon ions is carried out prior to the oxidation, the impurity of heavy metals gettered by the implanted carbon ions is drawn into the thick oxide film in a subsequent oxidation process. The element isolation region may be formed by use of other device isolation processes which are employed in the same manner as the LOCOS process, for forming the thick oxide film.

In accordance with the second method, a gettering of the impurity of heavy metals occurs when an annealing is carried out after the implantation of carbon ions. The impurity is fixed such that it overlaps with the distribution profile of implanted carbon atoms. As an oxide film is formed at a region in which a gettering of the heavy metals occurs, the gettered heavy metals are drawn into the oxide film. By forming a new oxide film after the oxide film with the heavy metals, it is possible to obtain an Si surface with reduced contamination and an oxide film of a good quality.

In accordance with the third method, the gettering site is formed at the Si—SiO$_2$ boundary region, thereby improving the capability of effectively gettering heavy metals concentrated in the boundary region. This method utilizes a phenomenon that heavy metals are drawn into a distorted portion present in a crystal lattice of the Si—SiO$_2$ boundary surface, so that they are be concentrated.

In accordance this method, the gettering site is formed in the distorted portion, so that the gettering efficiency is improved.

The fourth method provides the same effect as the first method. Where this method is applied to a CCD solid state image sensor which has an element isolation region called a channel stop region, in addition to a general element isolation region such as LOCOS, it utilizes the channel stop region as the gettering site, so that the contamination of the channel region by the impurity is reduced, thereby enabling the charge transfer efficiency to be improved and the dark current to be reduced.

In this case, however, the concentration of p type impurity in the channel stop should be sufficiently high not to deplete the channel stop region.

BRIEF DESCRIPTION OF THE DRAWINGS

Other objects and aspects of the invention will become apparent from the following description of embodiments with reference to the accompanying drawings in which:

FIGS. 3 to 7b are schematic sectional views illustrating conventional methods for gettering heavy metals.

DETAILED DESCRIPTION OF THE PREFERRED EMBODIMENTS

The method of the present invention can use independently the above-mentioned methods. However, it is preferable to use two or more of the methods in combination, in terms of the efficiency.

Referring to FIGS. 1a to 1h, there is illustrated a method of manufacturing a semiconductor device in accordance with a first embodiment of the present invention, wherein the above-mentioned four methods are employed for a general Si-MOS integrated device.

Figure 1A:
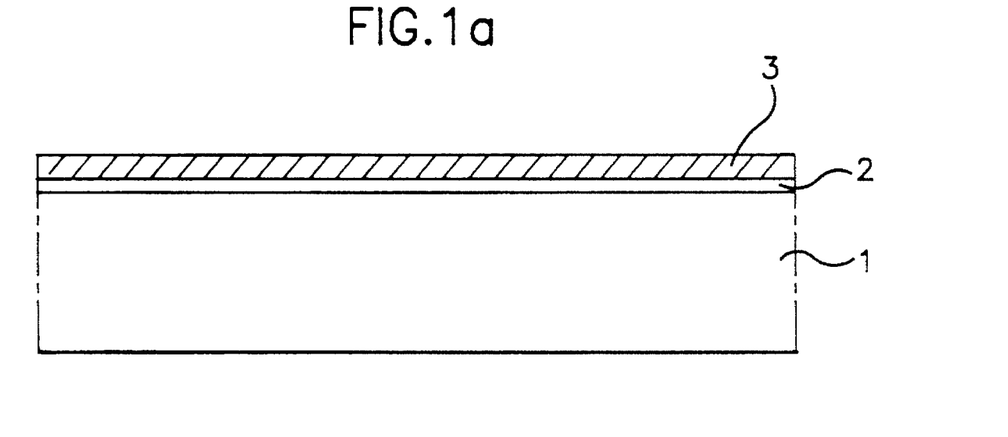
FIGS. 1a to 1h are schematic sectional views illustrating a method of manufacturing a semiconductor device in accordance with a first embodiment of the present invention.

In accordance with this method, first, on the surface of a p type Si substrate 1, an oxide film 2 and a SiN layer 3 are formed, as shown in FIG. 1a.

Figure 1B:
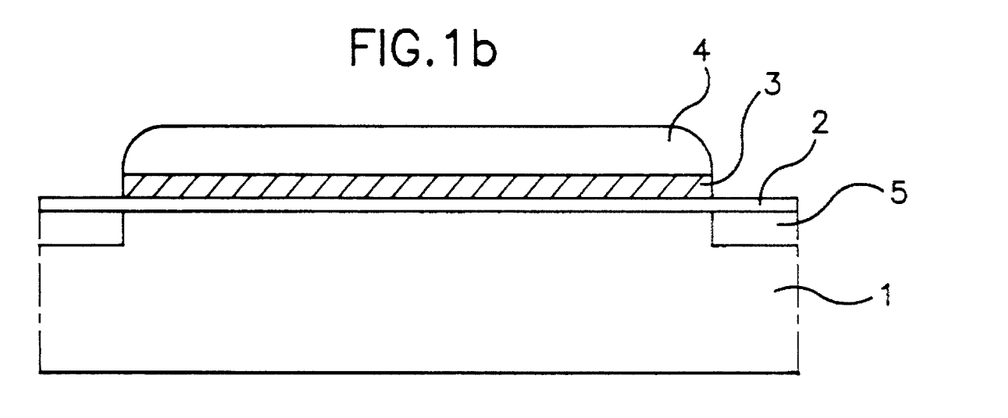

On the SiN layer 3, a photoresist pattern 4 is then formed which has an opening corresponding to an element isolation region. Using the photoresist pattern 4 as a mask, the SiN layer 3 is subjected to an etching, to be completely removed. Thereafter, an ion-implanted region 5 is formed by implanting boron ions and then carbon ions in the surface of substrate 1, as shown in FIG. 1b.

Figure 1C:
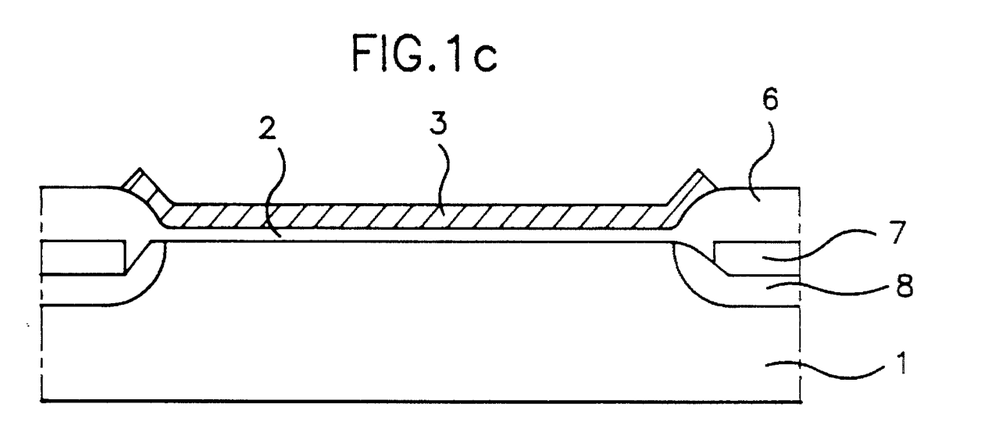

The photoresist pattern 4 is then removed. At a temperature of 950° C., nitrogen annealing and oxidizing processes are carried out, to form a thick oxide film 6 at the element isolation region. By these high temperature processes, boron ions are deeply diffused in the Si substrate 1, so that a $p^+$ region 8 is formed. On the other hand, the carbon ions contribute to a gettering of heavy metals and then are drawn into the oxide film 6, thereby forming a gettering site layer 7, as shown in FIG. 1c.

Figure 1D:
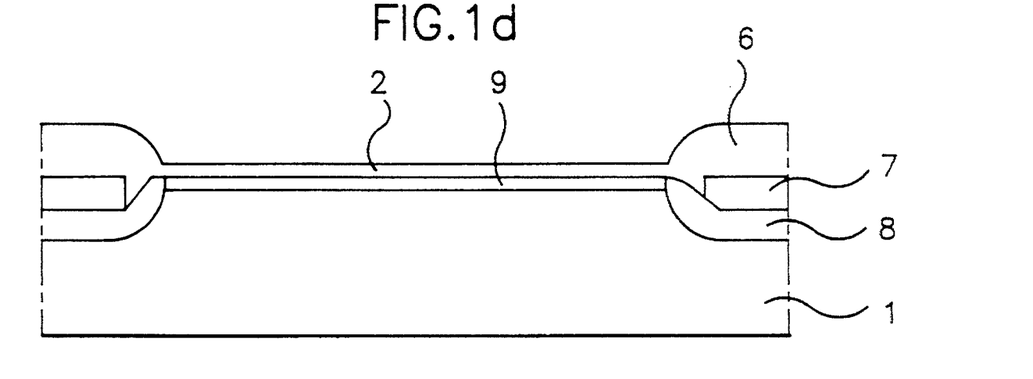

Thereafter, the SiN layer 3 is removed. As shown in FIG. 1d, carbon ions are then implanted again in the Si—SiO$_2$ boundary surface which is designated by the reference numeral 9.

As the annealing and oxidizing processes are carried out, a gettering occurs again, so that heavy metals are drawn into the oxide film formed.

Figure 1E:
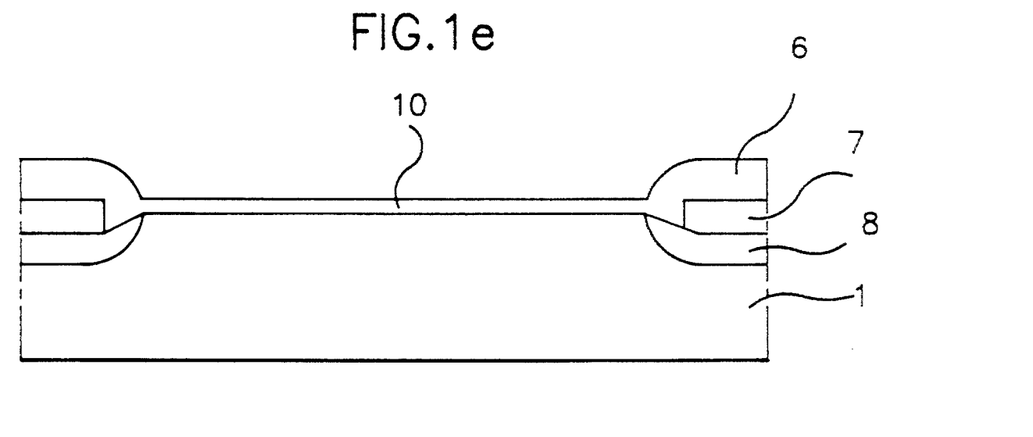

Subsequently, the oxide film containing the heavy metals is removed. At this time, the oxide film 6 formed at the element isolation region still remains because it has a sufficient thickness, whereas the region which had been disposed beneath SiN layer 3 is exposed. A gate oxide film 10 is formed over the exposed region, as shown in FIG. 1e.

Figure 1F:
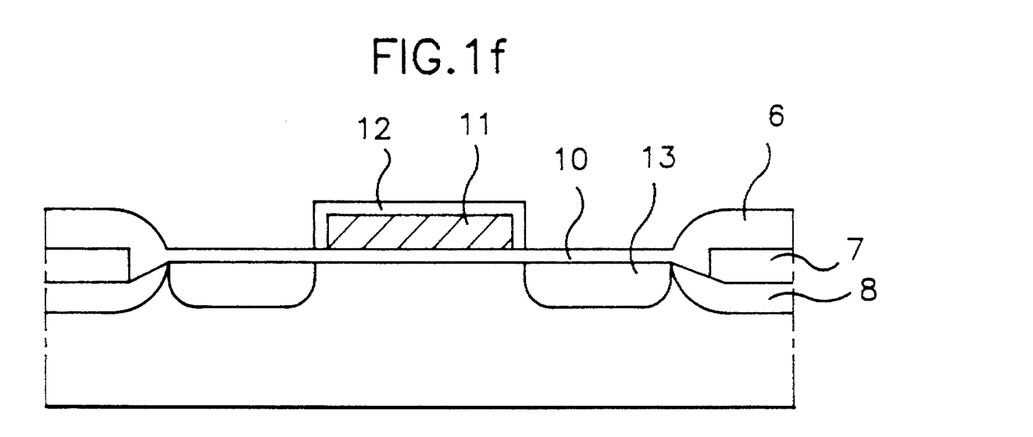

Over the gate oxide film 10, a polysilicon gate electrode 11 and an oxide film 12 covering the polysilicon gate electrode 11 are then formed. Using the polysilicon gate electrode 11 as a mask, an implantation of As ions is then carried out, to form a $n^+$ region 13 in the surface of substrate 1, as shown in FIG. 1f.

Figure 1G:
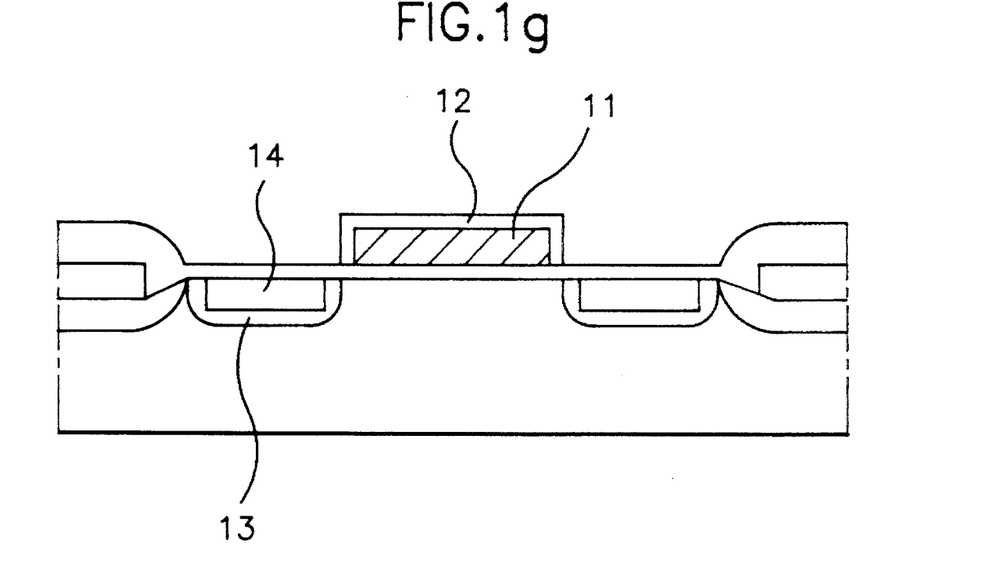

Thereafter, an implantation of carbon ions and an annealing are performed, to form a gettering site 14 in the $n^+$ region 13. By these processes, heavy metals become gettered in the gettering site 14. At this time, As ions are diffused, to form a source and a drain, as shown in FIG. 1g.

Figure 1H:
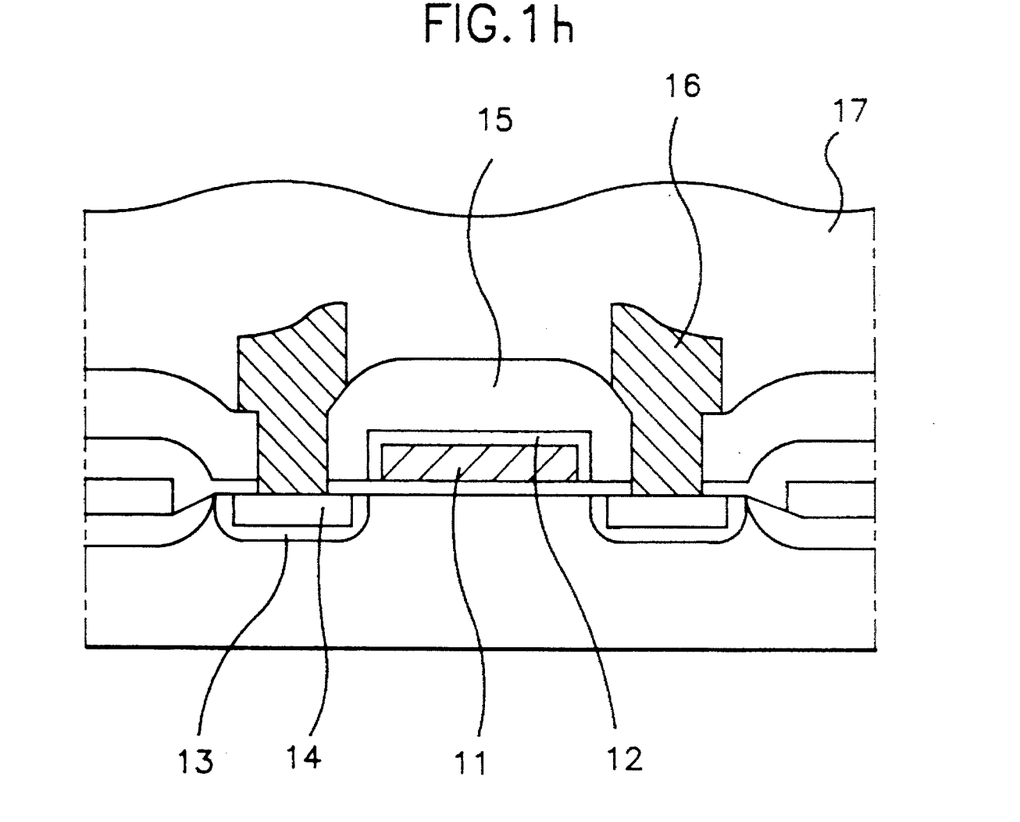

Then, formations of a smoothing layer 15, contact holes, an Al wiring layer 16 and a surface passivation layer 17 are achieved, as shown in FIG. 1h.

Referring to FIGS. 2a to 2i, there is illustrated a method of manufacturing a semiconductor device in accordance with a second embodiment of the present invention, wherein it is applied employed for manufacturing a two-dimensional solid state image sensor.

For forming peripheral portions of the two-dimensional solid state image sensor, this embodiment utilizes the same processes as the first embodiment.

Figure 2A:
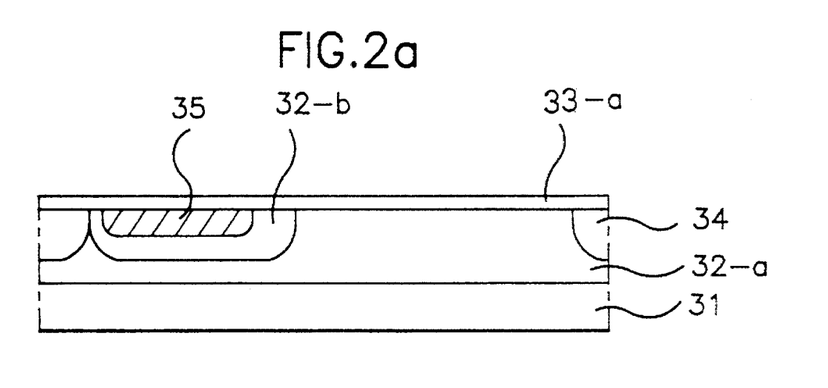
FIGS. 2a to 2i are schematic sectional views illustrating a method of manufacturing a semiconductor device in accordance with a second embodiment of the present invention.

In accordance with this method, first, on the surface of a n type Si substrate 31, a first p-well layer 32-a, a second p-well layer 32-b, a vertical CCD channel region 35, a Si oxide film 33-a and a channel stop region 34 corresponding to a CCD element isolation region are formed, by use of well-known manufacture processes for solid state image sensor, as shown in FIG. 2a.

Figure 2B:
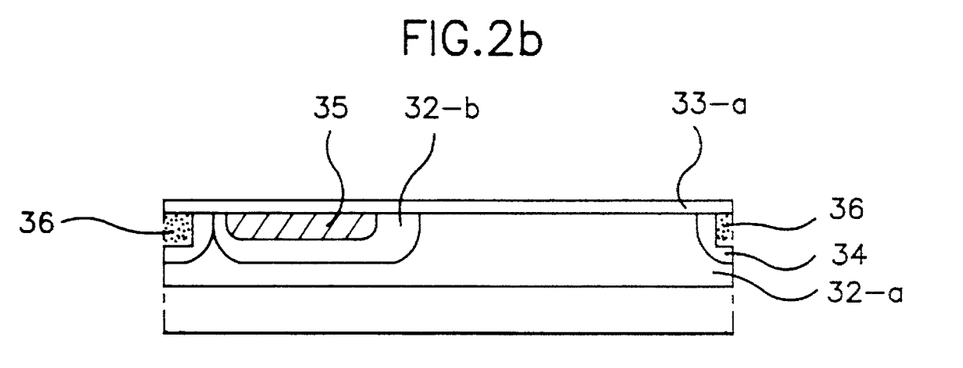

Thereafter, carbon ions are implanted in the channel stop region 34 which is, in turn, subjected to an annealing, so that heavy metals present in a region near the surface of substrate 31 are fixed in a gettering site 36 formed by virtue of the carbon ion implantation, as shown in FIG. 2b.

Figure 2C:
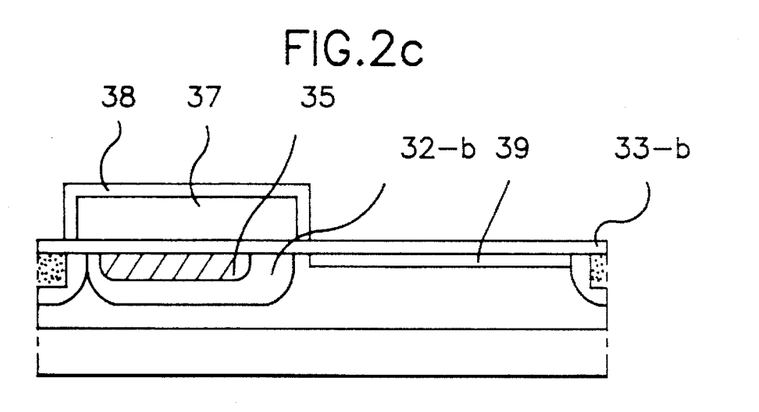

Subsequently, the Si oxide layer 33-a is removed. A gate oxide film 33-b is then formed over the entire exposed surface of the resultant structure. On the vertical CCD channel region 35, a polysilicon transfer electrode 37 is formed, which is, in turn, oxidized, thereby forming an oxide film 38. As shown in FIG. 1d, carbon ions are then implanted again in the Si—SiO$_2$ boundary surface which is designated by the reference numeral 9. Thereafter, carbon ions are implanted in the surface of a region at which a photodiode is to be formed, thereby forming a gettering site 39, as shown in FIG. 2c.

Figure 2D:
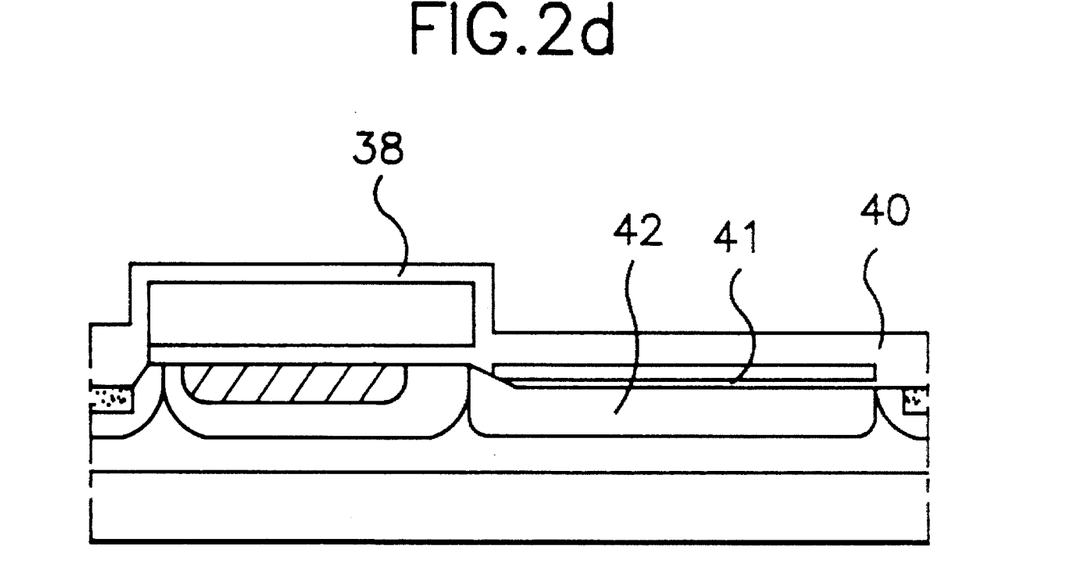

A photodiode 42 is then formed by implanting ions in the photodiode region. Subsequently, an oxidation is carried out, so that the gettering site 39 is drawn into an oxide film 40 which is formed by the oxidation, as shown in FIG. 2d. In FIG. 2d, the reference numeral 41 denotes the heavy metals drawn into the oxide film 40.

Figure 2E:
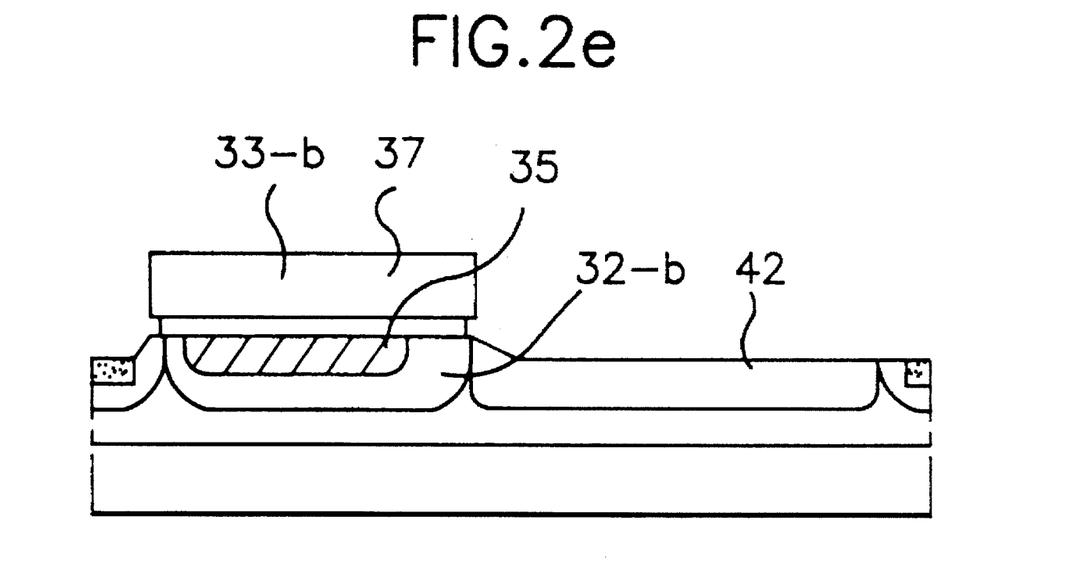

Removal of the gate oxide film 33-b and oxide film 40 is then achieved, as shown in FIG. 2e. Thus, the gettering site 39 and the heavy metals 41 are removed.

Figure 2F:
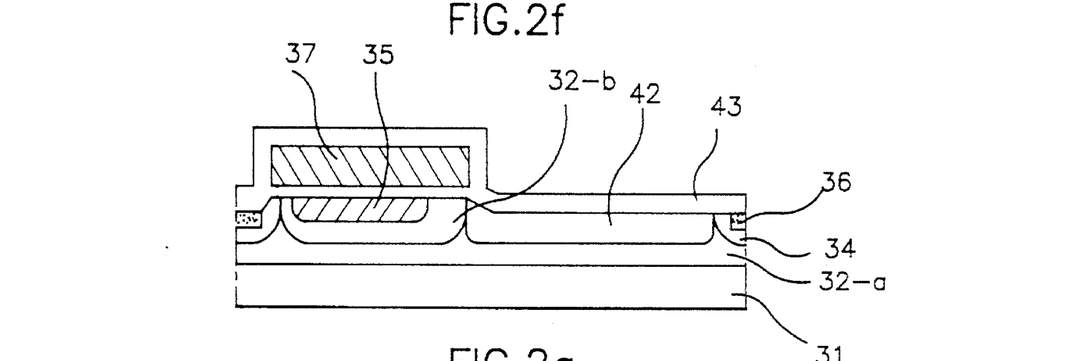
Figure 2G:
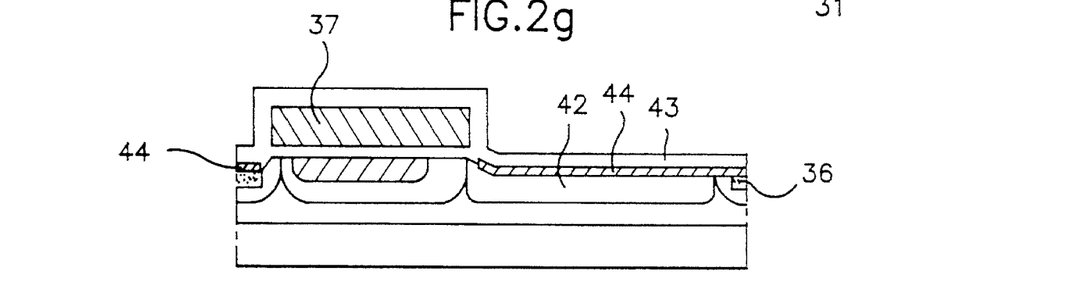

Next, an oxide film 43 is formed over the entire exposed surface of the resultant structure, as shown in FIG. 2f. Boron and carbon ions are then implanted in the Si—SiO$_2$ boundary surface corresponding to the surface of photodiode 42, thereby forming an ion-implanted layer 44, as shown in FIG. 2g.

Figure 2H:
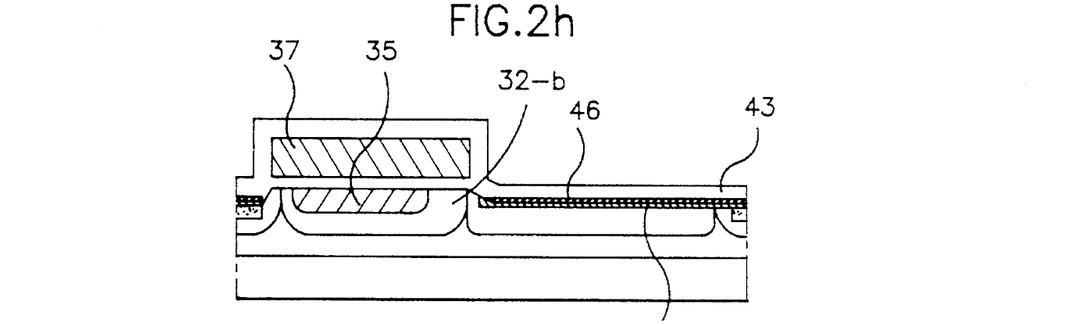

As the annealing process is then carried out, the boron ions are diffused, so that a $p^+$ region 45 is formed at the surface of photodiode 42. On the other hand, the carbon ions contribute to a gettering of heavy metals, so that a gettering layer 46 is formed, as shown in FIG. 2h.

Figure 2I:
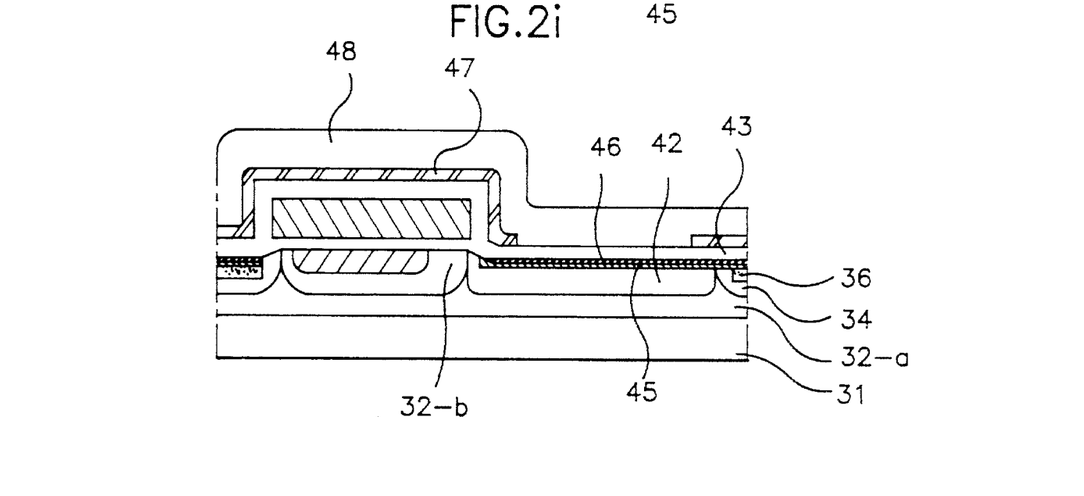

Thereafter, formations of a photo-shield layer 47 and a surface passivation layer 48 are achieved, to obtain a solid state image sensor, as shown in FIG. 2i.

Although this embodiment has been described as employing the above-mentioned methods in combination, it can obtain sufficient effects even in a case of employing only one of the methods.

As apparent from the above description, the present invention makes it possible to form semiconductor devices while reducing the contamination of silicon substrate surfaces by heavy metals. The present invention also realizes the manufacture of silicon semiconductor devices exhibiting a stable device characteristic and having reduced defects.

The implantation of carbon ions which is employed as one of means of the present invention can be achieved by use of a conventional ion implanting apparatus. Accordingly, there is no required an expensive equipment for implanting ions of high energy. Furthermore, it is possible to achieve a gettering at a high efficiency. As a result, the requirement standard for the contamination by heavy metals can be loosened, thereby enabling the installation cost to be reduced.

In particular, where the present invention is applied to Si-CCD image sensors, image defects can be considerably reduced, thereby enabling the yield to be greatly improved. Also, a reduction in dark current can be obtained, thereby causing the dynamic range to be increased. Accordingly, semiconductor devices with a highly dense integration degree can be obtained.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a silicon semiconductor device, comprising the steps of:

forming a first oxide film over a silicon substrate of a first conductivity type and a SiN layer over said first oxide film;

removing said SiN layer over a region wherein an element isolation region is to be formed;

implanting boron ions and then carbon ions in said region wherein the element isolation region is to be formed;

after said implanting step, annealing said region wherein the element isolation region is to be formed;

forming a second oxide film by oxidation of said silicon substrate;

said second oxide film having a thickness sufficient to cover said carbon-ion implanted region;

removing the remaining portion of the SiN layer;

removing said first oxide film;

forming a gate oxide film over a surface exposed after the removal of the first oxide film; and forming a gate electrode over said gate oxide film.

2. A method in accordance with claim 1 wherein said implanting step includes the density of the carbon ions being lower than $1 \times 10^{14}/cm^2$.

3. A method in accordance with claim 1 wherein said annealing step includes annealing the entire silicon substrate.

4. A method for manufacturing a silicon semiconductor device, comprising the steps of:

forming a first oxide film over a silicon substrate of a first conductivity type;

implanting carbon ions in a region disposed beneath a boundary surface between said first oxide film and said silicon substrate;

heat treating said carbon ion-implanted region so as to form a gettering site and getter heavy metal impurities;

additionally oxidizing said first oxide film to increase thickness, resultant thickness of said additional oxidation being sufficient to cover said carbon ion-implanted region, heavy metal impurities present in the silicon substrate are drawn into said first oxide film to be gettered;

removing said first oxide film together with said gettered heavy metal impurities; and forming a second oxide film thereon.

5. A method in accordance with claim 4 wherein said implanting step includes the dosage of the carbon ions being not greater than $1 \times 10^{14}/cm^2$.

6. A method in accordance with claim 1, wherein said step of implanting carbon ions is carried out at an acceleration voltage causing a projected range of ion implantation to be within 1,000 Å from a boundary surface between said silicon substrate and said first oxide film.

7. A method in accordance with claim 4, wherein said implanting step is carried out at an acceleration voltage causing a projected range of ion implantation to be within 1,000 Å from a boundary surface between said silicon substrate and said first oxide film.

8. A method in accordance with claim 5 wherein said heat treating step includes the heat treating temperature being 950° C.

* * * * *